(12) United States Patent
Kwon et al.

(10) Patent No.: US 9,627,329 B1
(45) Date of Patent: Apr. 18, 2017

(54) INTERPOSER WITH EDGE REINFORCEMENT AND METHOD FOR MANUFACTURING SAME

(71) Applicant: Xilinx, Inc., San Jose, CA (US)

(72) Inventors: Woon-Seong Kwon, Cupertino, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/175,920

(22) Filed: Feb. 7, 2014

(51) Int. Cl.
*H01L 21/56* (2006.01)
*H01L 23/00* (2006.01)
*H01L 23/31* (2006.01)

(52) U.S. Cl.
CPC .......... *H01L 23/562* (2013.01); *H01L 21/563* (2013.01); *H01L 23/3185* (2013.01)

(58) Field of Classification Search
CPC .. H01L 23/562; H01L 23/3185; H01L 21/563
USPC .................. 257/737, 795; 438/126
See application file for complete search history.

(56) References Cited

U.S. PATENT DOCUMENTS

| 6,656,773 | B2 * | 12/2003 | Boyaud | H01L 21/565 257/E21.503 |
| 2006/0051889 | A1 * | 3/2006 | Yamunan | H01L 21/563 438/106 |
| 2006/0087033 | A1 * | 4/2006 | Goh et al. | 257/737 |
| 2008/0157329 | A1 * | 7/2008 | Inoue | 257/686 |
| 2010/0244024 | A1 * | 9/2010 | Do et al. | 257/48 |
| 2011/0084384 | A1 * | 4/2011 | Sakata et al. | 257/737 |
| 2012/0080787 | A1 * | 4/2012 | Shah | H01L 21/4853 257/737 |
| 2012/0091579 | A1 * | 4/2012 | Park et al. | 257/737 |
| 2012/0098123 | A1 * | 4/2012 | Yu et al. | 257/737 |
| 2012/0159118 | A1 * | 6/2012 | Wong | H01L 25/105 712/1 |
| 2012/0187583 | A1 * | 7/2012 | Karpur et al. | 257/787 |
| 2012/0193779 | A1 * | 8/2012 | Lee | H01L 23/3135 257/737 |
| 2012/0211885 | A1 * | 8/2012 | Choi et al. | 257/737 |
| 2013/0228908 | A1 * | 9/2013 | Takahashi | 257/676 |

OTHER PUBLICATIONS

Zhang, Z et al., "Recent Advances in Flip-Chip Underfill: Materials, Process, and Reliability", Aug. 2004, pp. 515-524, vol. 27, No. 3, IEEE Transactions on Advanced Packaging.

* cited by examiner

*Primary Examiner* — Christine Enad
(74) *Attorney, Agent, or Firm* — Robert M. Brush

(57) ABSTRACT

A TSV interposer having a reinforced edge and methods for fabricating an IC package utilizing the same are provided. In one embodiment, a chip package includes an interposer having a wiring layer and a die disposed on a surface of the interposer. The die is electrically connected to the wiring layer of the interposer. A die underfill material is disposed between the interposer and the die. The die underfill material at least partially covers a side of the die that extends away from the surface of the interposer. Stiffening material is disposed in contact with the interposer and the die underfill material.

17 Claims, 5 Drawing Sheets

INTERPOSER WITH EDGE REINFORCEMENT AND METHOD FOR MANUFACTURING SAME

BACKGROUND OF THE INVENTION

Field of the Invention

Embodiments of the present invention generally relate to chip packaging, and in particular, to a through-silicon-via (TSV) interposer and integrated circuit (IC) die.

Description of the Related Art

Conventional chip packaging schemes often utilize a through-silicon-via (TSV) interposer to enable a plurality of integrated circuit (IC) dies to be mounted to a single organic substrate. The interposer generally includes an interconnect wiring layer disposed on a core. The interconnect wiring layer is coupled by micro-bump solder connections to the various dies disposed on the interposer. Since the interposer is generally very thin, it is susceptible to damage, and particularly cracking during handling after soldering steps of the fabrication cycle.

One conventional process for increasing the stiffness of the interposer to reduce damage is to laminate one or more stiffening layers to the interposer. However, the laminated stiffening layers increase material costs and complicate the fabrication sequence, thus undesirably increasing the manufacturing cost of the interposer. Another conventional process for increasing the stiffness of the interposer is to bond a prefabricated stiffening ring on the surface of the interposer. However, adding a prefabricated stiffening ring will also increase material costs and complicate the fabrication sequence, which as discussed above, undesirably increases the manufacturing cost of the interposer.

Therefore, a need exists for an improved interposer and methods for fabricating a chip package utilizing the same.

SUMMARY OF THE INVENTION

A TSV interposer having a reinforced edge and methods for fabricating an IC package utilizing the same are provided. In one embodiment, a chip package includes an interposer having a wiring layer and a die disposed on a surface of the interposer. The die is electrically connected to the wiring layer of the interposer. A die underfill material is disposed between the interposer and die. The die underfill material at least partially covers a side of the die that extends away from the surface of the interposer. Stiffening material is disposed in contact with the interposer and the die underfill material.

In another embodiment, methods for making a chip package are provided. The method for making a chip package includes coupling a die to an interposer, dispensing a die underfill material between the die and interposer, and dispensing a stiffening material in contact with the interposer and the die underfill material.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Embodiments of the invention generally provide a TSV interposer having a reinforced edge and methods for fabricating an IC package utilizing the same. The edge of the TSV interposer is reinforced after mounting the IC dies to the interposer without adding additional prefabricated components, thus maintaining a simple and cost effective manufacturing scheme. The edge reinforced TSV interposer additionally can be fabricated with little to no additional tooling than currently utilized to mount dies and package substrates to the interposer.

Figure 1:
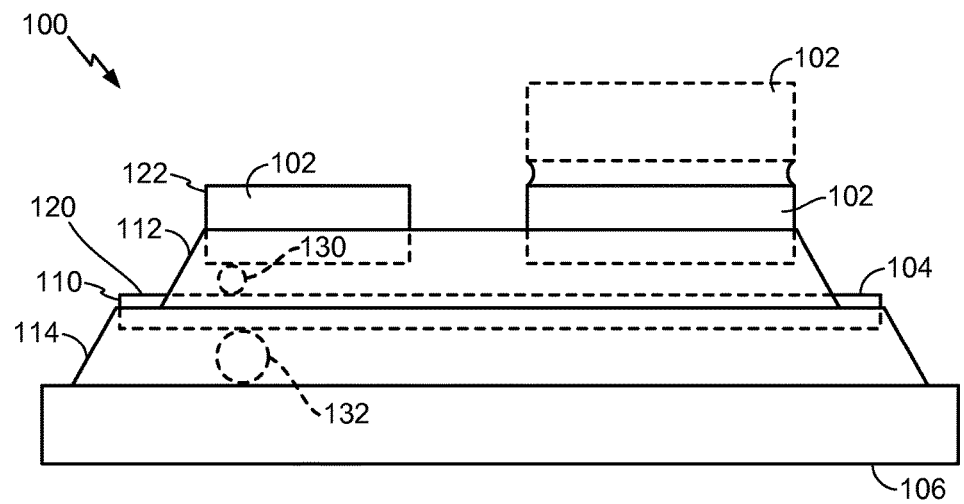
FIG. 1 is a front side view of an integrated chip package including a plurality of IC dies connected by a TSV interposer to a package substrate.

FIG. 1 is a front side view of one embodiment of an integrated chip package 100 including a plurality of IC dies 102 connected by a TSV interposer 104 to a package substrate 106. The interposer 104 includes circuitry for electrically connecting the dies 102 to circuitry of the package substrate 106. The circuitry of the interposer 104 may optionally include transistors.

An interposer underfill material 114 is disposed between the TSV interposer 104 and the package substrate 106 to increase the structural integrity of the package substrate-to-interposer interface. The interposer underfill material 114 may be an epoxy or other suitable material.

The interposer underfill material 114 covers the package bumps 132, also known as "C4 bumps," which provide the electrical connection between the circuitry of the interposer 104 and the circuitry of the package substrate 106. Only one package bump 132, shown in phantom, is illustrated in FIG. 1 to minimize drawing clutter. The package substrate 106 may be mounted and connected to a printed circuit board (PCB), utilizing solder balls, wire bonding or other suitable technique. The PCB is not shown in FIG. 1.

The IC dies 102 are mounted to one or more surfaces of the interposer 104. The IC dies 102 may be programmable logic devices, such as field programmable gate arrays (FPGA), memory devices, processors or other IC logic structures. In the embodiment depicted in FIG. 1, the IC dies 102 are mounted to a top surface 120 of the interposer 104 by a plurality of micro-bumps 130. Only one micro-bump 130, shown in phantom, is illustrated in FIG. 1. The micro-bumps 130 electrically connect the circuitry of each IC die 102 to circuitry of the interposer 104. The circuitry of the interposer 104 connects the micro-bumps 130 to selective package bumps 132, and hence, connects selective circuitry of each IC die 102 to the package substrate 106, to enable communication of the dies 102 with the PCB after the package 100 is mounted.

Figure 2:
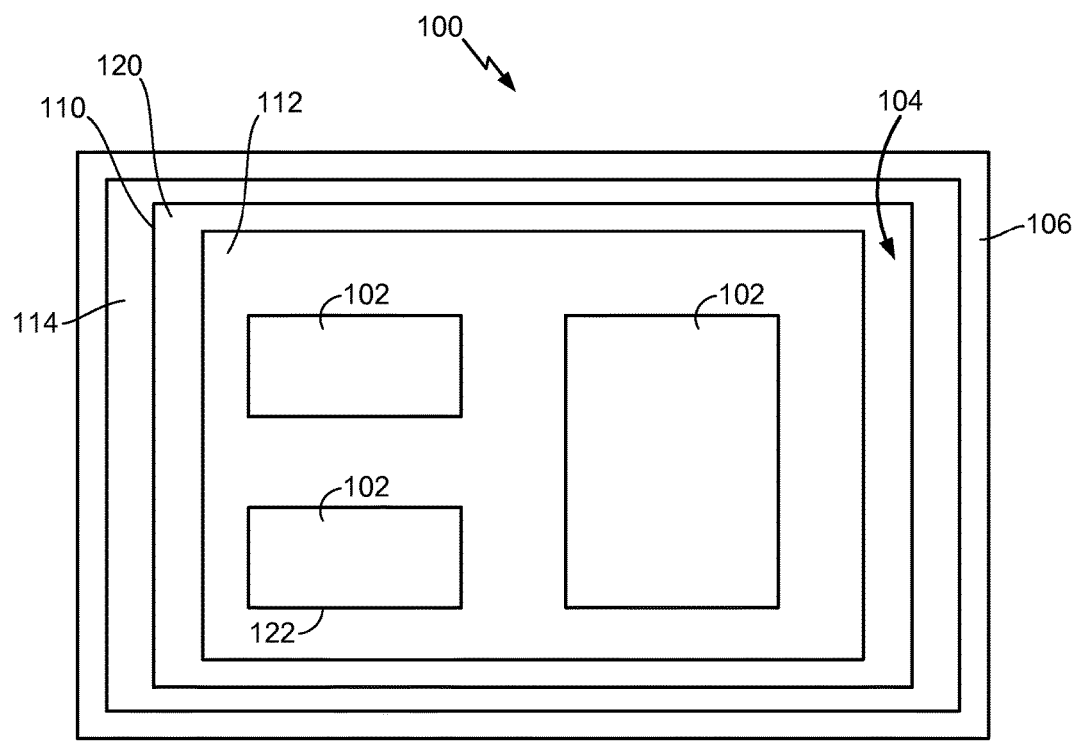
FIG. 2 is a top view of the integrated chip package of FIG. 1.

The IC dies 102 may be disposed on the interposer 104 in any suitable arrangement. For example, the IC dies 102 may be disposed on the interposer 104 in a 3-D array, such as shown in FIG. 2. Optionally, one or more IC dies 102 may be stacked on the IC die 102 that is disposed on the top surface 120 of interposer 104, such as shown in phantom in FIG. 1.

Continuing to refer to both FIG. 1 and FIG. 2, a portion of the top surface 120 of the interposer 104 is covered with a stiffening material 112. The stiffening material 112 is in contact with both an edge 122 of the die 102 and the top surface 120 of the interposer 104, thereby increasing the rigidity and strength of the interposer 104 proximate a perimeter edge 110 of the interposer 104. The interposer 104, reinforced by the stiffening material 112, is more robust and less likely to crack or become damaged from handling during the subsequent fabrication processes.

Figure 3:
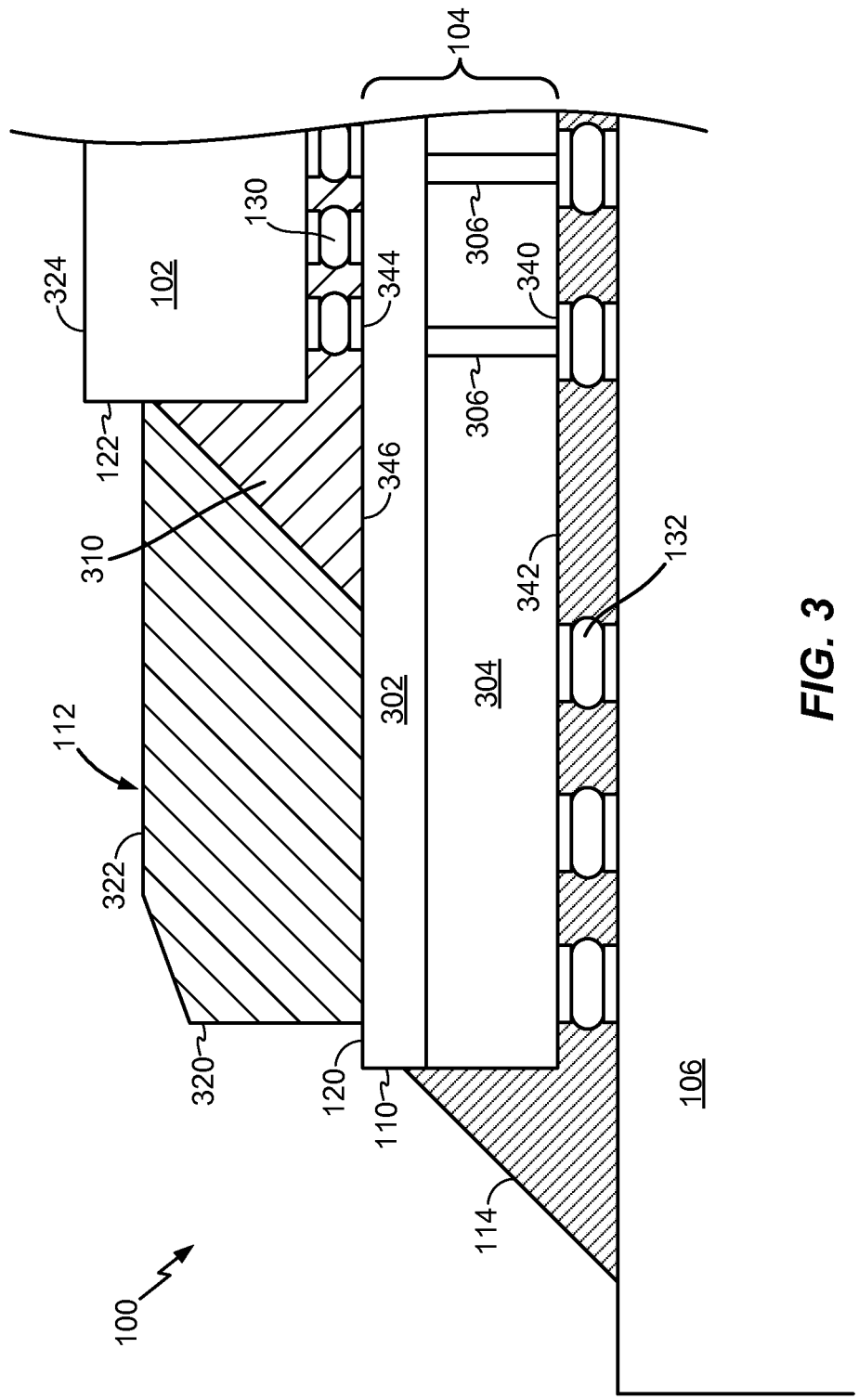
FIG. 3 is a partial sectional view of the integrated chip package of FIG. 1.

FIG. 3 is a partial sectional view of the integrated chip package 100 of FIG. 1 illustrating the interface between the die 102, the interposer 104 and the package substrate 106 at the edge 110 of the interposer 104. The interposer 104 includes a wiring layer 302 and a body 304. The body 304 may be fabricated from silicon or other suitable material. The body 304 includes a plurality of conductive vias 306 formed therethrough. A conductive pad 340 is formed on a bottom surface 342 of the interposer 104 at the terminus of each vias 306. Each conductive pad 340 is coupled by one of the package bumps 132 to circuitry of the package substrate 106. The opposite end of each via 306 is connected to circuitry defined in the wiring layer 302.

The wiring layer 302 is formed by one or more conductive layers and one more dielectric layers patterned to provide electrical circuitry (i.e., electrical paths) between the vias 306 and conductive pads 344 formed on the top surface 346 of the wiring layer 302. The top surface 346 of the wiring layer 302 is also the top surface 120 of the interposer 104. The conductive pads 344 are coupled by the micro-bumps 130 to the circuitry of the dies 102.

A die underfill material 310 is disposed between the TSV interposer 104 and the die 102 to increase the structural integrity of the die to interposer interface. The die underfill material 310 covers the micro-bumps 130, which provide the electrical connection between the conductors of the interposer 104 and the die 102. The die underfill material 310 may have a low viscosity and low surface tension between the die and interposer materials so that the die underfill material 310 may wick between and fill the interstitial space defined between the interposer 104 and die 102. The die underfill material 310 may be an epoxy-based or other suitable material. The die underfill material 310 may additionally include fillers, such as silica ($SiO_2$). The die underfill material 310 may have a coefficient of thermal expansion (CTE) between about 20 to about 40 ppm/degree Celsius. The die underfill material 310 may have a viscosity of between about 5 to about 20 Pascal Second (Pa*S). The die underfill material 310 may have a Youngs modulus of between about 6 to about 15 Pascal (Pa). The die underfill material 310 may have a thixotropic index of between about 0.5 to about 1.5, which allows the die underfill material 310 to wick between the interposer 104 and the die 102 via capillary action.

The interposer underfill material 114 may be the same as, or similar to, the die underfill material 310. The interposer underfill material 114 is generally wicked between the interposer 104 and package substrate 106 via capillary action.

Although the embodiments of FIGS. 1-3 illustrate underfill material 310, 114 which utilize capillary action to move to a final position in the chip package 100, the underfill material 310, 114 may be formed on the chip package 100 utilizing any other suitable technique. For example, the underfill material 310, 114 may be disposed in the interstitial space adjacent the interposer 104 utilizing pressurized encapsulation, vacuum-assisted dispensing, dams, vented substrates, molding, no-flow and thermal compression techniques.

The stiffening material 112 provides a mechanical reinforcement at the edge of the interposer 104. The stiffening material 112 may be an epoxy-based material or other suitable material. The stiffening material 112 may additionally include fillers, for example, inorganic fillers such as silica ($SiO_2$). The stiffening material 112 may have a CTE between about 20 to about 40 ppm/degree Celsius. The stiffening material 112 may have a viscosity of between about 5 to about 20 Pa*S. The stiffening material 112 may have a Youngs modulus of between about 6 to about 15 Pascal (Pa).

The stiffening material 112 may have a thixotropic index of between about 2.0 to about 4.0, which allows the stiffening material 112 to remain in contact with the interposer 104 and die 102 once dispensed without flowing off the edge of the interposer 104. Thus, thixotropic stiffening materials 112 may be easily dispensed around the perimeter of the die 102 utilizing readily available dispensing equipment, which enables the stiffening material 112 to be added to the chip package 100 with minimal tooling and production costs.

Since the stiffening material 112 adds an additional layer adhered over the perimeter of the interposer 104, the interposer 104 will be more resistive to bending. Additionally, the adhesion of the stiffening material 112 to the sidewall of the die 102 provides a gusset-like structure, which significantly strengthens the interposer 104. In the embodiment depicted in FIG. 3, the stiffening material 112 extends over "dummy" package bumps 132 (e.g., package bumps 132 not connected to one of the vias 306) so that the interposer 104 is supported on both sides to provide additional structural integrity which further increases the resistance of the interposer 104 to bending.

The stiffening material 112 covers and adheres to the die underfill material 310 but leaves a top 324 of the die 102 exposed. Thus, the stiffening material 112 is mechanically bonded to the side 122 of the die 102 to increase the strength of the interposer 104 while allowing heat to radiate from the top 324 of the die 102 so as not to diminish the performance of the circuitry and devices formed in the die 102 due to overheating.

Although the embodiment of FIGS. 1-3 illustrate stiffening material 112 which is thixotropical to substantially remain in its dispensed position without physical retention devices such as dams, a thixotropic or non-thixotropic stiffening material 112 may alternatively be disposed between a dam or mold positioned outward of the die 102.

Figure 4:
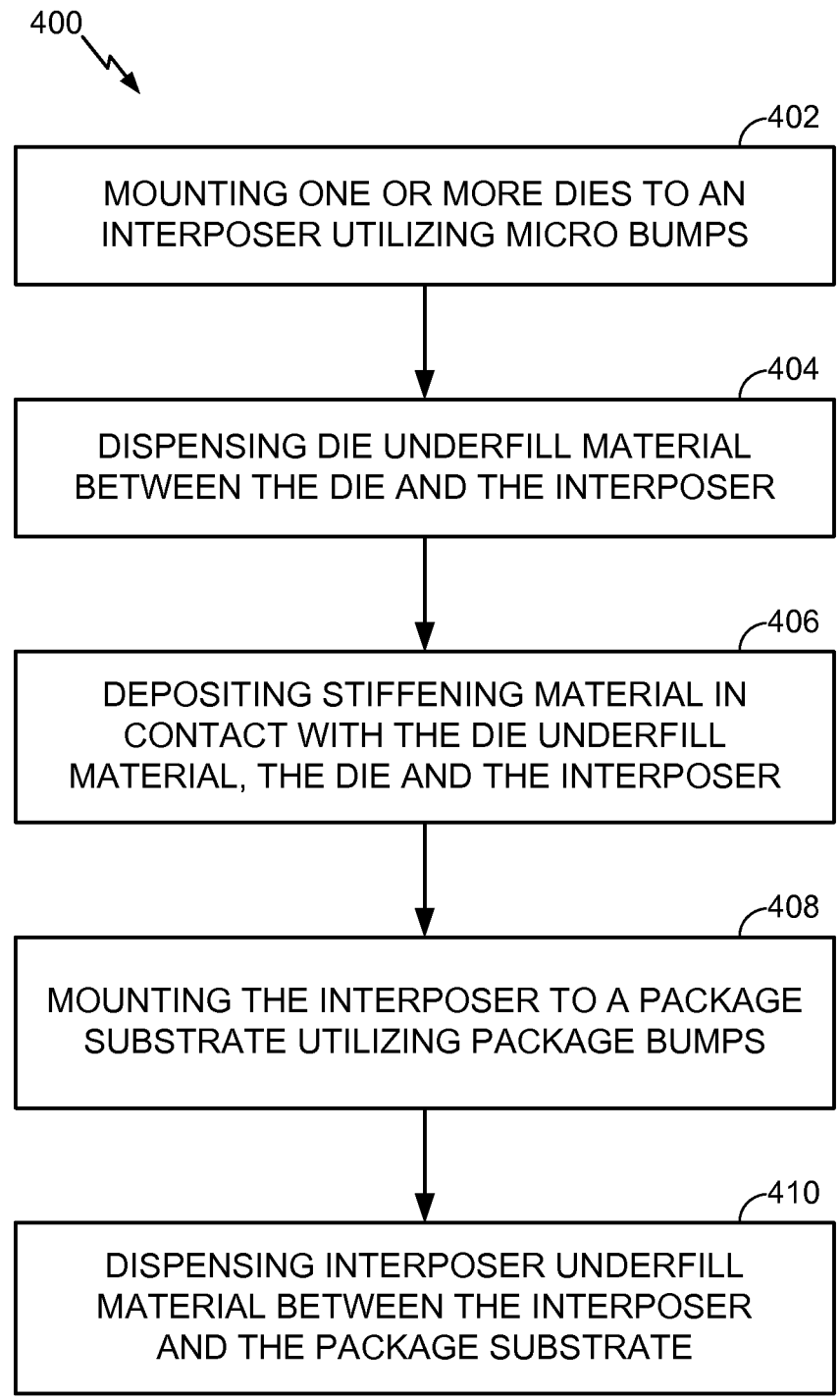
FIG. 4 is a flow diagram illustrating one embodiment of a method for fabricating the chip package of FIG. 1.

FIG. 4 is a flow diagram illustrating one embodiment of a method 400 for fabricating the chip package, such as for example, the chip package 100 of FIG. 1. The method 400 begins at step 402 by mounting one or more dies 102 to the interposer 104 utilizing micro-bumps 130. At step 404, die underfill material 310 is wicked or otherwise deposited between the die 102 and interposer 104. After curing, the die underfill material 310 provides structural rigidity between the die 102 and interposer 104.

At step 406, stiffening material 112 is deposited in contact with the die underfill material 310, the die 102 and the interposer 104. After curing, the die underfill material 310 stiffens the area of the interposer 104 between the edge 110 of the interposer 104 and side 122 of the die 102. The stiffening material 112 provides increased mechanical strength to the edge 110 of the interposer 104 thereby allowing the interposer 104 to be handled from the edge 110 with reduced risk of cracking or other damage during the remainder of the chip package fabrication process. The stiffening material 112 may be deposited as a thixotropic material through a needle or nozzle using a robotically controlled dispensing system. The stiffening material 112 may also be deposited by screen printing, ink jet printing, spraying, troweling, or other suitable technique. Alternatively, a mold or dam, for example made of a resist or other suitable material, may be positioned on the edge 110 of the interposer 104 so that the stiffening material 112 may be disposed in the volume confined between the side 122 of the die 102, the top surface 120 of the interposer 104 and the inner wall of the dam. The dam may be removed after dispensing the stiffening material 112 using a wet etch process, such as with dilute HF or acetic acid. Alternatively, the dam may be left as part of the chip package 100. In embodiments wherein the stiffening material 112 is a thixotropic material, the stiffening material 112 may be deposited directly on the interposer 104 without need for a dam as the viscosity of the thixotropic stiffening material 112 prevents the stiffening material 112 from flowing over the edge 110 of the interposer 104 or moving away from the side 122 of the die 102 prior to curing.

The stiffening material 112 may be deposited to a height that covers the die underfill material 310, and may extend up to the top 324 of the die 102. It may be desirable to prevent the stiffening material 112 from contacting the top 324 of the die 102 to prevent thermally insulating the die 102 and preventing heat from escaping from the top 324 of the die 102.

The stiffening material 112 may be deposited laterally outward from the side 122 of the die 102 to the edge 110 of the interposer 104, thus covering the die underfill material 310 exposed outward of the die 102. A laterally outward edge 320 of the stiffening material 112 may be offset laterally inward the edge 110 of the interposer 104 to allow automated equipment to grip or contact the interposer 104 directly during subsequent assembly operations. The stiffening material 112 may be deposited on the interposer 104 laterally outward of the outermost via 306 formed through the interposer 104, which further enhances interposer bending resistance.

At step 408, the interposer 104 is mounted to the package substrate 106 utilizing the package bumps 132. At step 410, interposer underfill material 114 is wicked between the interposer 104 and the package substrate 106. After curing, the interposer underfill material 114 provides structural rigidity between the interposer 104 and the package substrate 106, leaving the package 100 ready for cleaning and shipping.

Figure 5:
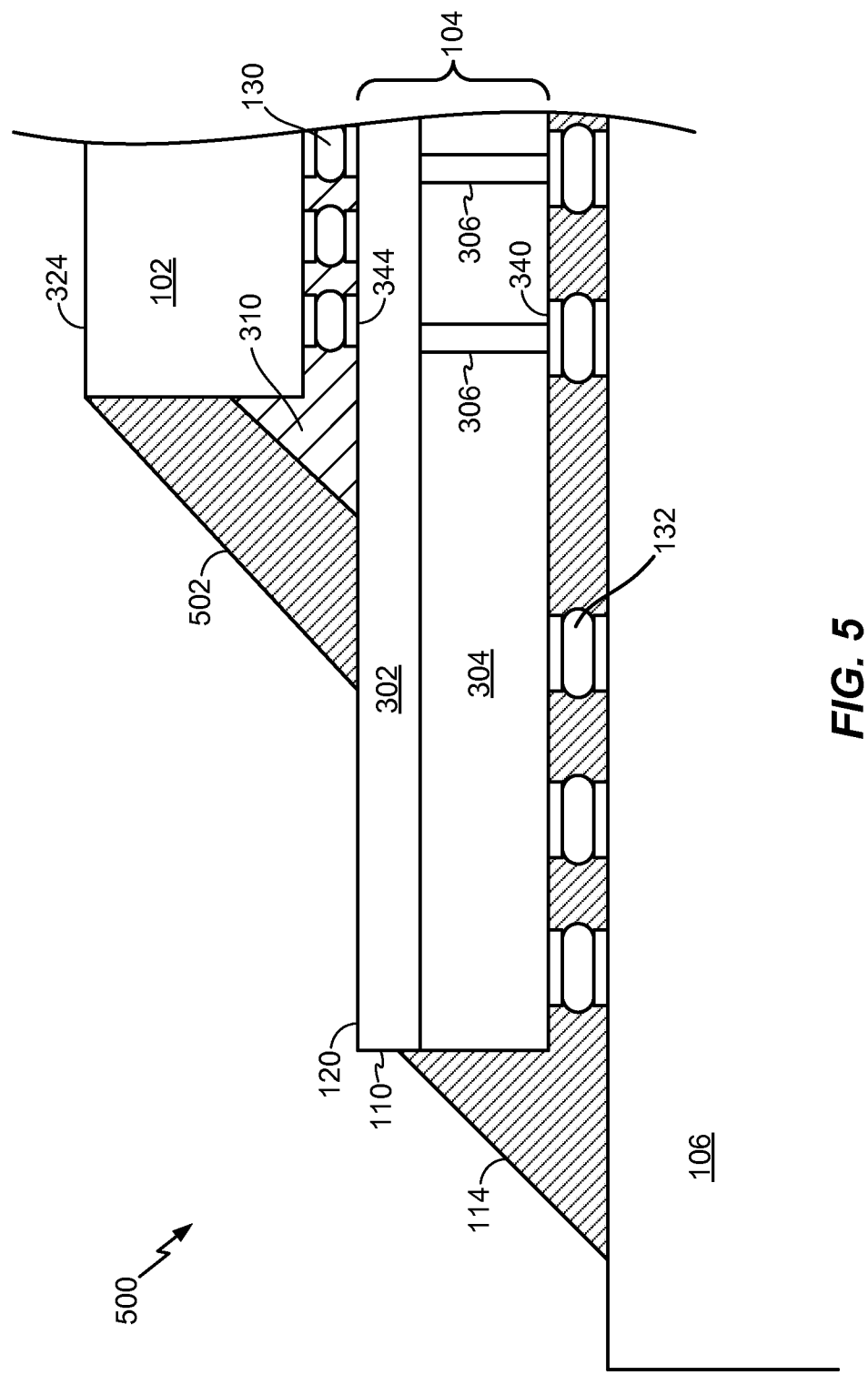
FIG. 5 is a partial sectional view of another embodiment of an integrated chip package including a plurality of IC dies connected by a TSV interposer to a package substrate.

FIG. 5 is a partial sectional view of another embodiment of a chip package 500 including a plurality of IC dies 102 connected by a TSV interposer 104 to a package substrate 106. Only one IC die 102 is shown in FIG. 5, but the chip package 500 may include additional dies 102 as described with reference to the chip package 100 and shown in FIGS. 1-2. The chip package 500 is constructed similar to the chip package 100 described above, except wherein stiffening material 502 is deposited on interposer 104 of the chip package 500 after the interposer 104 is mounted to the package substrate 106 utilizing package bumps 132.

The stiffening material 502 may be similar to or the same as the stiffening material 112 described above. The stiffening material 502 may also be similar to or the same as the interposer underfill material 114 wicked between the interposer 104 and the package substrate 106.

In the embodiment depicted in FIG. 5, the stiffening material 502 is the same as the interposer underfill material 114. Accordingly, the stiffening material 502 may be an epoxy-based or other suitable material. The stiffening material 502 may additionally include fillers, for example inorganic fillers such as silica ($SiO_2$). The stiffening material 502 may have a coefficient of thermal expansion (CTE) between about 20 to about 40 ppm/degree Celsius. The stiffening material 502 may have a viscosity of between about 5 to about 20 Pascal Second (Pa*S). The stiffening material 502 may have a Youngs modulus of between about 6 to about 15 Pascal (Pa). A dam or mold may optionally be utilized to retain the stiffening material 502 prior to curing.

Since the stiffening material 502 may be dispensed with the same tooling utilized to dispense the interposer underfill material 114, little or no additional tooling or materials may be required to dispense the stiffening material 502 around the perimeter of the die 102. Thus, the stiffening material 502 to be added to the chip package 100 with essentially no additional tooling cost with very little additional fabrication time as compared to conventional non-reinforced chip packages.

Figure 6:
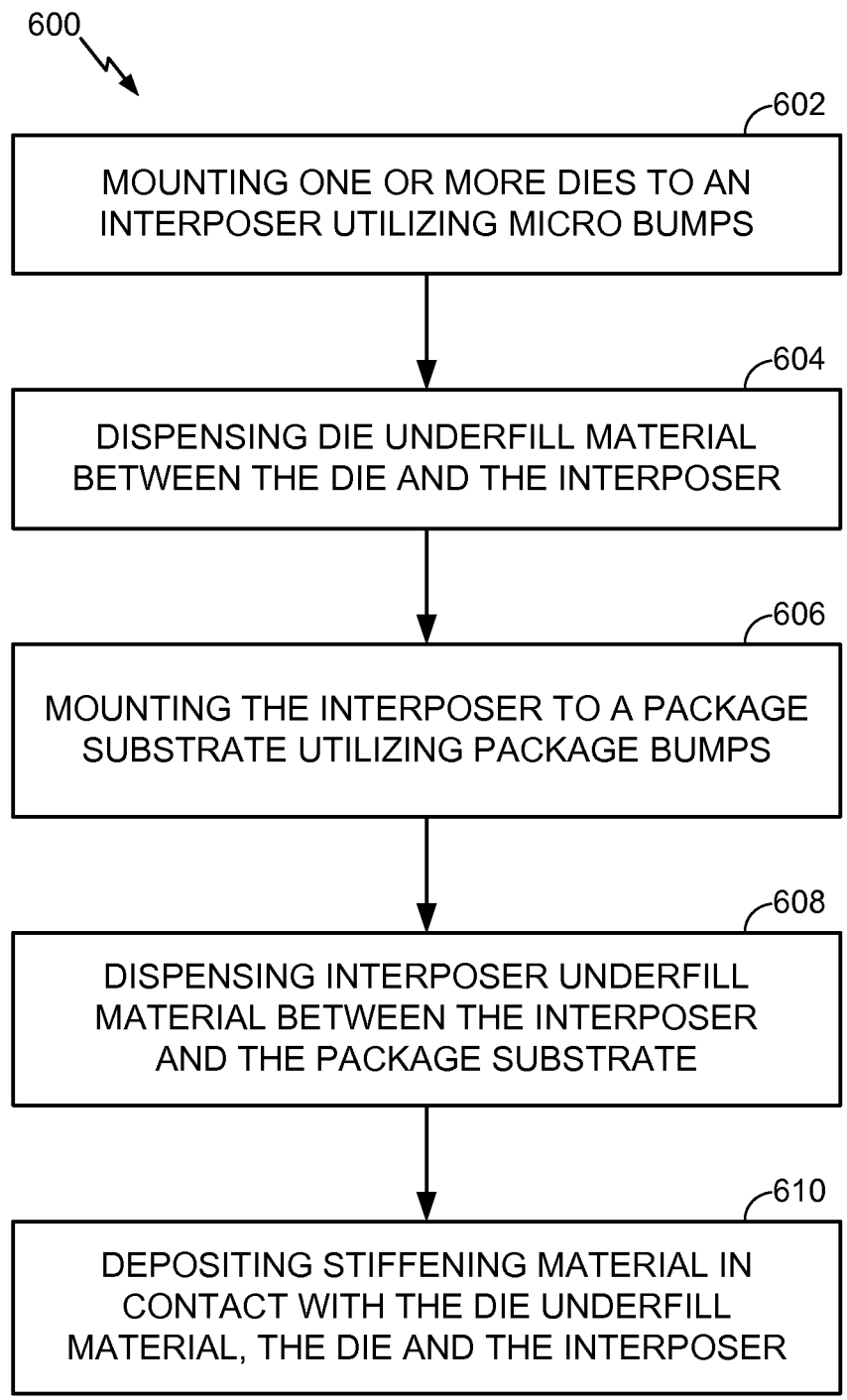
FIG. 6 is a flow diagram illustrating a method for fabricating the chip package of FIG. 5.

FIG. 6 is a flow diagram illustrating one embodiment of a method 600 for fabricating the chip package, such as for example, the chip package 500 of FIG. 5. The method 600 begins at step 602 by mounting one or more dies 102 to the interposer 104 utilizing micro-bumps 130. At step 604, die underfill material 310 is wicked between the die 102 and interposer 104. After curing, the die underfill material 310 provides structural rigidity between the die 102 and interposer 104.

At step 606, the interposer 104 is mounted to the package substrate 106 utilizing the package bumps 132. At step 608, interposer underfill material 114 is wicked between the interposer 104 and the package substrate 106. After curing, the interposer underfill material 114 provides structural rigidity between the interposer 104 and the package substrate 106.

At step 608, stiffening material 502 is deposited in contact with the die underfill material 310, the die 102 and the interposer 104. After curing, the stiffening material 502 reinforces edge 110 of the interposer 104 outward of the die 102, thus reducing potential for cracking or other damage to the interposer 104 during the remainder of the fabrication cycle of the chip package 500. In embodiments wherein the stiffening material 502 is the same as the interposer underfill material 114, the stiffening material 502 deposited on the interposer 104 utilizing the same equipment utilized to dispense the interposer underfill material 114.

The stiffening material 502 may be deposited through a needle or nozzle using a robotically controlled dispense system. The stiffening material 502 may also be deposited by screen printing, ink jet printing, spraying, troweling, or other suitable technique. Alternatively, a dam, for example made of a resist material, may be positioned on the edge 110 of the interposer 104 so that the stiffening material 502 may be disposed in the volume confined between the side 122 of the die 102, the top surface 120 of the interposer 104 and the inner wall of the dam. The dam, if not left as part of the chip package 500, may be removed using a wet etch process, such as with dilute HF or acetic acid. In embodiments wherein the stiffening material 502 is a thixotropic material, the stiffening material 502 may be deposited on the interposer 104 without need for a dam as the viscosity of the thixotropic stiffening material 502 will prevent the stiffening material 502 from flowing over the edge 110 of the interposer 104 or moving away from the side 122 of the die 102.

The stiffening material 502 may be deposited to a height that covers the die underfill material 310, and may extend up to the top 324 of the die 102. It may be desirable to prevent the stiffening material 502 from contacting the top 324 of the die 102 to prevent thermally insulating the die 102 and preventing heat from escaping from the top 324 of the die 102.

The stiffening material 502 may be deposited laterally outward from the side 122 of the die 102 to the edge 110 of the interposer 104, thus covering the die underfill material 310 exposed outward of the die 102. A laterally outward edge 320 of the stiffening material 502 may be offset laterally inward the edge 110 of the interposer 104 to allow automated equipment to grip or contact the interposer 104 directly during subsequent assembly operations. The stiffening material 502 may be deposited on the interposer 104 laterally outward of the last via 306 formed through the interposer 104, which further enhances interposer bending resistance.

The chip packages described above advantageously minimize warpage and thermo-mechanical cracking of the interposer due to handling during fabrication and from temperature cycling. Particularly, as the stiffening material is not an integral part of the interposer, the cost and complexity of the interposer is not increased. Furthermore, as the stiffening material is deposited on the interposer during the die and substrate mounting process, additional tooling is essentially not required to reinforce the edge of the interposer, thus allowing the interposer to be significantly strengthened with minimal cost impact.

While the foregoing is directed to embodiments of the present invention, other and further embodiments of the invention may be devised without departing from the basic scope thereof, and the scope thereof is determined by the claims that follow.

What is claimed is:

1. A chip package comprising:
   an interposer having a wiring layer;
   a die disposed on a surface of the interposer, the die electrically connected to the wiring layer;
   a die underfill material disposed between the interposer and the die, the die underfill material at least partially covering a side of the die extending away from the surface of the interposer; and
   a stiffening material disposed in contact with the interposer, the die underfill material, and a side of the die and not in contact with a top surface of the die, the stiffening material having a bottom surface in contact with the interposer, a top surface spaced apart from the bottom surface, and a laterally outer edge that extends between the respective top surface and bottom surfaces, is perpendicular to the surface of the interposer, and is offset inward an edge of the interposer and not dammed, the top surface of the stiffening material including a flat portion parallel to the interposer and a sloping portion between the flat portion and the laterally outer edge of the stiffening material, the stiffening material having a modulus greater than a modulus of the die underfill material.

2. The chip package of claim 1, wherein the stiffening material comprises:
   a thixotropic material.

3. The chip package of claim 1, wherein the stiffening material comprises:
   an epoxy-based material.

4. The chip package of claim 1, wherein the stiffening material comprises: a material having a pre-cured viscosity greater than a pre-cured viscosity of the die underfill material.

5. The chip package of claim 1, wherein the stiffening material comprises:
   a viscosity greater than a viscosity of the die underfill material.

6. The chip package of claim 1, wherein the stiffening material comprises:
   a thixotropic index greater than a thixotropic index of the die underfill material.

7. The chip package of claim 1 further comprising:
   a package substrate electrically coupled to the interposer, and
   an interposer underfill material disposed between the interposer and package substrate.

8. The chip package of claim 7, wherein the stiffening material comprises the same material as the interposer underfill material.

9. The chip package of claim 8, wherein the stiffening material comprises:
   a thixotropic material.

10. The chip package of claim 8, wherein the stiffening material extends over dummy solder bumps positioned laterally outward of the die.

11. The chip package of claim 1, wherein the die is selected from the group consisting of a programmable logic device, a processor and memory.

12. A method of making a chip package, comprising:
    coupling a die to an interposer;
    dispensing a die underfill material between the die and the interposer; and
    dispensing a stiffening material onto the interposer, the dispensed stiffening material in contact with a surface of the interposer, the die underfill material, and a side of the die and not in contact with a top surface of the die, the stiffening material having a bottom surface in contact with the interposer, a top surface spaced apart from the bottom surface, and a laterally outer edge that extends between the respective top surface and bottom surfaces, is perpendicular to the surface of the interposer, and is offset inward an edge of the interposer and not dammed, the top surface of the stiffening material including a flat portion parallel to the interposer and a sloping portion between the flat portion and the laterally outer edge of the stiffening material, the stiffening material having a modulus greater than a modulus of the die underfill material.

13. The method of claim 12, wherein dispensing the stiffening material comprises:
    dispensing a thixotropic material on the interposer surface.

14. The method of claim 12, wherein depositing the stiffening material comprises:
    screen printing, ink jet printing, spraying, or troweling the stiffening material on the interposer surface.

15. The method of claim 12, wherein dispensing the stiffening material comprises:
   depositing the stiffening material in contact with a side of the die.

16. The method of claim 12 further comprising;
   depositing an interposer underfill material between the interposer and a package substrate, wherein the interposer underfill material and the stiffening material are the same.

17. The method of claim 12, wherein dispensing the stiffening material comprises:
   depositing the stiffening material on a portion of the interposer outward of an outermost via formed through the interposer.

* * * * *